United States Patent
Mercep et al.

(10) Patent No.: US 10,802,450 B2
(45) Date of Patent: Oct. 13, 2020

(54) SENSOR EVENT DETECTION AND FUSION

(71) Applicant: Mentor Graphics Corporation, Wilsonville, OR (US)

(72) Inventors: Ljubo Mercep, Munich (DE); Matthias Pollach, Munich (DE)

(73) Assignee: Mentor Graphics Corporation, Wilsonville, OR (US)

( * ) Notice: Subject to any disclaimer, the term of this patent is extended or adjusted under 35 U.S.C. 154(b) by 346 days.

(21) Appl. No.: 15/419,914

(22) Filed: Jan. 30, 2017

(65) Prior Publication Data

US 2018/0067463 A1 Mar. 8, 2018

Related U.S. Application Data

(60) Provisional application No. 62/385,156, filed on Sep. 8, 2016, provisional application No. 62/385,149, filed on Sep. 8, 2016.

(51) Int. Cl.
*G06F 16/00* (2019.01)
*G05B 17/00* (2006.01)
(Continued)

(52) U.S. Cl.
CPC .............. *G05B 17/02* (2013.01); *G01C 21/28* (2013.01); *G01C 21/3407* (2013.01);
(Continued)

(58) Field of Classification Search
CPC ..... G05B 17/02; G06F 16/5854; G06F 16/29; G06F 17/5009; G06F 30/20; G01C 21/28;
(Continued)

(56) References Cited

U.S. PATENT DOCUMENTS

| | | |
|---|---|---|
| 4,796,191 A | 1/1989 | Honey et al. |
| 5,363,305 A | 11/1994 | Cox et al. |

(Continued)

FOREIGN PATENT DOCUMENTS

| | | |
|---|---|---|
| CN | 101 876 750 B | 11/2015 |
| EP | 2 107 503 A1 | 10/2009 |
| WO | 2009/070069 A1 | 6/2009 |

OTHER PUBLICATIONS

Barzilay and Szolovits, "Exact inference in bayes nets—pseudocode." Mass. Init. Technology (retrieved at http://courses.csail.mit.edu/6.034s/handouts/spring12/bayesnets-pseudocode.pdf on Jun. 4, 2018), Feb. 2012.

(Continued)

*Primary Examiner* — Angelina Shudy
(74) *Attorney, Agent, or Firm* — Mentor Graphics Corporation

(57) ABSTRACT

This application discloses a computing system to implement sensor event detection and fusion system in an assisted or automated driving system of a vehicle. The computing system can monitor an environmental model to identify spatial locations in the environmental model populated with temporally-aligned measurement data. The computing system can analyze, on a per-sensor basis, the temporally-aligned measurement data at the spatial locations in the environmental model to detect one or more sensor measurement events. The computing system can utilize the sensor measurement events to identify at least one detection event indicative of an object proximate to the vehicle. The computing system can combine the detection event with at least one of another detection event, a sensor measurement event, or other measurement data to generate a fused detection event. A control system for the vehicle can control operation of the vehicle based, at least in part, on the detection event.

17 Claims, 9 Drawing Sheets

(51) Int. Cl.
| | | |
|---|---|---|
| G05B 17/02 | (2006.01) | |
| G05D 1/00 | (2006.01) | |
| G05D 1/02 | (2020.01) | |
| G06F 16/29 | (2019.01) | |
| G06F 16/583 | (2019.01) | |
| G01S 7/48 | (2006.01) | |
| G06K 9/00 | (2006.01) | |
| G08G 1/16 | (2006.01) | |
| G01S 13/86 | (2006.01) | |
| G01C 21/34 | (2006.01) | |
| G06F 30/20 | (2020.01) | |
| G01S 17/931 | (2020.01) | |
| G01C 21/36 | (2006.01) | |
| G01C 21/28 | (2006.01) | |
| G01S 13/931 | (2020.01) | |
| G01S 15/931 | (2020.01) | |
| G01S 13/72 | (2006.01) | |

(52) U.S. Cl.
CPC ..... *G01C 21/3415* (2013.01); *G01C 21/3667* (2013.01); *G01S 7/4808* (2013.01); *G01S 13/862* (2013.01); *G01S 13/865* (2013.01); *G01S 13/867* (2013.01); *G01S 13/931* (2013.01); *G01S 15/931* (2013.01); *G01S 17/931* (2020.01); *G05D 1/0088* (2013.01); *G05D 1/021* (2013.01); *G05D 1/024* (2013.01); *G05D 1/0246* (2013.01); *G05D 1/0255* (2013.01); *G05D 1/0257* (2013.01); *G05D 1/0259* (2013.01); *G05D 1/0268* (2013.01); *G05D 1/0276* (2013.01); *G06F 16/29* (2019.01); *G06F 16/5854* (2019.01); *G06F 30/20* (2020.01); *G06K 9/00791* (2013.01); *G08G 1/161* (2013.01); *G08G 1/163* (2013.01); *G08G 1/164* (2013.01); *G01S 13/723* (2013.01); *G01S 2013/93271* (2020.01); *G01S 2013/93272* (2020.01); *G01S 2013/93274* (2020.01); *G05D 1/0278* (2013.01); *G05D 2201/0213* (2013.01)

(58) Field of Classification Search
CPC ............ G01C 21/3407; G01C 21/3415; G01C 21/3667; G01S 7/4808; G01S 13/862; G01S 13/865; G01S 13/867; G01S 13/931; G01S 15/931; G01S 17/936; G01S 13/723; G01S 2013/9375; G01S 2013/9378; G01S 2013/9385; G01S 17/13; G01S 17/723; G01S 2013/93274; G01S 2013/93271; G01S 2013/93272; G01S 17/931; G05D 1/0088; G05D 1/021; G05D 1/024; G05D 1/0246; G05D 1/0255; G05D 1/0257; G05D 1/0259; G05D 1/0268; G05D 1/0276; G05D 1/0278; G05D 2201/0213; G06K 9/00791; G08G 1/161; G08G 1/163; G08G 1/164
USPC ........................................................ 701/23
See application file for complete search history.

(56) References Cited

U.S. PATENT DOCUMENTS

| | | | |
|---|---|---|---|
| 5,508,931 A | 4/1996 | Snider | |
| 5,883,586 A | 3/1999 | Tran | |
| 6,453,223 B1 | 9/2002 | Kelly | |
| 7,164,472 B2 | 1/2007 | Dorrance et al. | |
| 8,665,080 B2 | 3/2014 | Nagamine | |
| 8,805,648 B2 | 8/2014 | Painsky | |
| 8,912,978 B2 | 12/2014 | Szczerba | |
| 9,043,072 B1 | 5/2015 | Tisdale et al. | |
| 9,097,800 B1 | 8/2015 | Zhu | |
| 9,243,916 B2 | 1/2016 | Roumeliotis | |
| 9,285,805 B1 | 3/2016 | Pollock | |
| 9,315,192 B1 | 4/2016 | Zhu et al. | |
| 9,321,461 B1 | 4/2016 | Silver et al. | |
| 9,336,436 B1 | 5/2016 | Dowdall | |
| 9,384,402 B1* | 7/2016 | Furman ............... H04N 19/167 | |
| 9,690,293 B2 | 1/2017 | Shashua | |
| 9,612,123 B1 | 4/2017 | Levinson | |
| 9,623,905 B2 | 4/2017 | Shashua | |
| 9,665,100 B2 | 5/2017 | Shahuas | |
| 9,672,446 B1 | 6/2017 | Vallespi-Gonzalez | |
| 9,696,719 B2 | 7/2017 | Aviel | |
| 9,709,986 B2 | 7/2017 | Gdalyahi | |
| 9,719,801 B1 | 8/2017 | Ferguson et al. | |
| 9,760,090 B2 | 9/2017 | Shashua | |
| 10,268,191 B1* | 4/2019 | Lockwood ........... G05D 1/0022 | |
| 10,317,901 B2* | 6/2019 | Oder ................... G05D 1/0088 | |
| 10,564,638 B1* | 2/2020 | Lockwood ............... G06N 7/00 | |
| 2001/0040505 A1 | 11/2001 | Ishida | |
| 2004/0064241 A1 | 4/2004 | Sekiguchi | |
| 2005/0078304 A1* | 4/2005 | Dorrance ............. G01B 11/275 356/139.09 |
| 2005/0258943 A1 | 11/2005 | Mian et al. | |
| 2007/0010933 A1 | 1/2007 | Hochkirchen | |
| 2007/0182623 A1 | 8/2007 | Zeng | |
| 2008/0033645 A1 | 2/2008 | Levinson et al. | |
| 2008/0243378 A1 | 2/2008 | Zavoli | |
| 2008/0189003 A1 | 8/2008 | Gillula | |
| 2009/0195371 A1 | 8/2009 | Camus | |
| 2009/0228204 A1 | 9/2009 | Zavoli | |
| 2009/0268947 A1 | 10/2009 | Schaufler | |
| 2009/0278673 A1 | 11/2009 | Li | |
| 2010/0013615 A1 | 1/2010 | Herbert et al. | |
| 2010/0191391 A1 | 7/2010 | Zeng | |
| 2010/0217522 A1 | 8/2010 | Ando et al. | |
| 2012/0136510 A1 | 5/2012 | Min et al. | |
| 2012/0310516 A1 | 12/2012 | Zeng | |
| 2012/0320213 A1 | 12/2012 | Ikeda et al. | |
| 2013/0091503 A1 | 4/2013 | Painsky | |
| 2013/0155418 A1 | 6/2013 | Shaw et al. | |
| 2013/0181860 A1 | 7/2013 | Le et al. | |
| 2013/0328862 A1 | 12/2013 | Piemonte | |
| 2013/0332061 A1 | 12/2013 | Dowdall et al. | |
| 2014/0111645 A1 | 4/2014 | Shylanski et al. | |
| 2014/0267415 A1 | 9/2014 | Tang et al. | |
| 2014/0334721 A1 | 11/2014 | Cervin et al. | |
| 2014/0358840 A1 | 12/2014 | Tadic | |
| 2014/0379254 A1 | 12/2014 | Miksa | |
| 2015/0049193 A1 | 2/2015 | Gupta et al. | |
| 2015/0073663 A1 | 3/2015 | Nilsson | |
| 2015/0127247 A1 | 5/2015 | Xu et al. | |
| 2015/0210312 A1 | 7/2015 | Stein | |
| 2015/0220086 A1 | 8/2015 | Willgert | |
| 2015/0268058 A1 | 9/2015 | Samarasekera | |
| 2015/0279182 A1 | 10/2015 | Kanaujia et al. | |
| 2016/0033297 A1 | 2/2016 | Konishi | |
| 2016/0039409 A1 | 2/2016 | Hayakawa | |
| 2016/0109564 A1 | 4/2016 | Sieber et al. | |
| 2016/0129917 A1 | 5/2016 | Gariepy et al. | |
| 2016/0140872 A1 | 5/2016 | Palmer | |
| 2016/0223643 A1 | 8/2016 | Li et al. | |
| 2016/0236683 A1 | 8/2016 | Eggert et al. | |
| 2016/0341822 A1 | 11/2016 | Wang et al. | |
| 2016/0357188 A1 | 12/2016 | Ansari | |
| 2016/0364985 A1 | 12/2016 | Penna et al. | |
| 2016/0368505 A1 | 12/2016 | Sorstedt et al. | |
| 2017/0008521 A1 | 1/2017 | Braunstein et al. | |
| 2017/0016740 A1 | 1/2017 | Cui et al. | |
| 2017/0050566 A1 | 2/2017 | Yamashita | |
| 2017/0060810 A1 | 3/2017 | Preston | |
| 2017/0076455 A1 | 3/2017 | Newman | |
| 2017/0080950 A1 | 3/2017 | Pink | |
| 2017/0090480 A1* | 3/2017 | Ho ..................... G05D 1/0027 | |
| 2017/0052032 A1 | 4/2017 | Miksa | |
| 2017/0123428 A1 | 5/2017 | Levinson et al. | |
| 2017/0124781 A1 | 5/2017 | Douillard | |

(56) References Cited

U.S. PATENT DOCUMENTS

| | | | |
|---|---|---|---|
| 2017/0139411 A1 | 5/2017 | Hartung et al. | |
| 2017/0176998 A1 | 6/2017 | Fechner et al. | |
| 2017/0190334 A1 | 7/2017 | Zelman | |
| 2017/0248963 A1 | 8/2017 | Levinson et al. | |
| 2017/0261324 A1 | 9/2017 | Roumeliotis | |
| 2017/0270361 A1 | 9/2017 | Puttagunta | |
| 2017/0277716 A1 | 9/2017 | Giurgiu et al. | |
| 2017/0297587 A1* | 10/2017 | Mimura | B60W 50/0097 |
| 2017/0305438 A1* | 10/2017 | Poledna | G06K 9/00791 |
| 2017/0316333 A1 | 11/2017 | Levinson et al. | |
| 2017/0329327 A1 | 11/2017 | Trigui et al. | |
| 2017/0329332 A1 | 11/2017 | Pilarski et al. | |
| 2017/0337690 A1 | 11/2017 | Arth et al. | |
| 2017/0343356 A1 | 11/2017 | Roumeliotis | |
| 2017/0372148 A1 | 12/2017 | Chen et al. | |
| 2018/0003512 A1 | 1/2018 | Lynch | |
| 2018/0018527 A1 | 1/2018 | Micks et al. | |
| 2018/0024565 A1 | 1/2018 | Fridman | |
| 2018/0025235 A1 | 1/2018 | Fridman | |
| 2018/0032082 A1 | 2/2018 | Shalev-shwartz | |
| 2018/0045521 A1 | 2/2018 | Wege et al. | |
| 2018/0060675 A1 | 3/2018 | Ji et al. | |
| 2018/0067488 A1 | 3/2018 | Pollach et al. | |
| 2018/0067489 A1 | 3/2018 | Oder et al. | |
| 2018/0067490 A1* | 3/2018 | Pollach | B60W 10/184 |
| 2018/0067495 A1 | 3/2018 | Oder et al. | |
| 2018/0067966 A1 | 3/2018 | Oder et al. | |
| 2018/0068206 A1 | 3/2018 | Pollach et al. | |
| 2018/0172454 A1 | 6/2018 | Ghadiok et al. | |
| 2018/0202814 A1 | 7/2018 | Kudrynski et al. | |
| 2018/0202815 A1 | 7/2018 | Asai | |
| 2018/0285658 A1* | 10/2018 | Gunther | G08G 1/161 |
| 2018/0307245 A1* | 10/2018 | Khawaja | B60W 30/00 |
| 2018/0314921 A1 | 11/2018 | Mercep et al. | |
| 2018/0332232 A1 | 11/2018 | Horak | |
| 2018/0336468 A1* | 11/2018 | Kadav | G06K 9/6217 |
| 2019/0011910 A1* | 1/2019 | Lockwood | G05D 1/0214 |
| 2019/0075252 A1* | 3/2019 | Zhao | G01C 21/00 |
| 2019/0086546 A1* | 3/2019 | Tsishkou | G01S 17/89 |
| 2019/0098471 A1 | 3/2019 | Rech et al. | |
| 2019/0236862 A1 | 8/2019 | Mercep et al. | |
| 2019/0236865 A1 | 8/2019 | Mercep et al. | |
| 2019/0258246 A1* | 8/2019 | Liu | G05D 1/0027 |
| 2020/0192366 A1* | 6/2020 | Levinson | G01S 17/86 |

OTHER PUBLICATIONS

T. M. Chan. "Optimal output-sensitive convex hull algorithms in two and three dimensions." Discrete and Computational Geometry, vol. 16, Issue No. 4, pp. 361-368, Jan. 1, 1996.

Hyunggi Cho, Young-Woo Seo, BVK Vijaya Kumar, and Ragunathan Raj Rajkumar. "A multi-sensor fusion system for moving object detection and tracking in urban driving environments." IEEE International Conference on Robotics and Automation (ICRA), pp. 1836-1843. IEEE, May 2014.

N. Dalai and B. Triggs. "Histograms of oriented gradients for human detection." IEEE Computer Society Conference on Computer Vision and Pattern Recognition (CVPR'05), vol. 1, pp. 886-893, Jun. 2005.

Martin Ester, Hans peter Kriegel, Jrg Sander, and Xiaowei Xu. "A density-based algorithm for discovering clusters in large spatial databases with noise." pp. 226-231. Proc. 2nd Int. Conf. Knowledge Discovery and Data Mining (KDD'96), American Association for Artificial Intelligence (AAAI) Press, Aug. 1996.

K. C. Fuerstenberg, K. C. J. Dietmayer, and V. Willhoeft. "Pedestrian recognition in urban traffic using a vehicle based multilayer laserscanner" IEEE Intelligent Vehicle Symposium, vol. 1, pp. 31-35, Jun. 2002.

Daniel Gohring, Miao Wang, Michael Schnurmacher, and Tinosch Ganjineh. "Radar/lidar sensor fusion for car-following on highways." IEEE 2011 5th International Conference on Automation, Robotics and Applications (ICARA), pp. 407-412, Dec. 2011.

John A Hartigan and Manchek A Wong. "Algorithm as 136: A k-means clustering algorithm." Journal of the Royal Statistical Society. Series C (Applied Statistics), vol. 28, issue 1, pp. 100-108, Jan. 1979.

S. C. Johnson. "Hierarchical clustering schemes." Psychometrika, vol. 32, issue 3, pp. 241-254, Sep. 1967.

N. Kaempchen, M. Buehler, and K. Dietmayer. "Feature-level fusion for freeform object tracking using laserscanner and video." Intelligent Vehicles Symposium, IEEE Proceedings, pp. 453-458, Jun. 2005.

Nico Kaempchen and Klaus Dietmayer. "Data synchronization strategies for multi-sensor fusion." Intelligent Transportation Systems, Proceedings of the IEEE Conference, pp. 1-9, Oct. 2003.

Nico Kampchen. "Feature-level fusion of laser scanner and video data for advanced driver assistance systems." University of Ulm Faculty, Engineering Sciences, Computer Science, Jun. 2007.

D. Kellner, M. Barjenbruch, K. Dietmayer, J. Klappstein, and J. Dickmann. "Instantaneous lateral velocity estimation of a vehicle using doppler radar." Information Fusion, Proceedings of the 16th International Conference, pp. 877-884, Jul. 2013.

P. Kmiotek and Y. Ruichek. "Representing and tracking of dynamics objects using oriented bounding box and extended kalman filter." 11th International IEEE Conference on Intelligent Transportation Systems, pp. 322-328, Oct. 2008.

S. Lange, F. Ulbrich, and D. Goehring. "Online vehicle detection using deep neural networks and lidar based preselected image patches." IEEE Intelligent Vehicles Symposium (IV), pp. 954-959, Jun. 2016.

H. A. Loeliger, J. Dauwels, J. Hu, S. Korl, L. Ping, and F. R. Kschischang. "The factor graph approach to model-based signal processing." Proceedings of the IEEE, vol. 95, issue 6, pp. 1295-1322, Jun. 2007.

M. Mahlisch, R. Schweiger, W. Ritter, and K. Dietmayer. "Sensorfusion using spatio-temporal aligned video and lidar for improved vehicle detection." IEEE Intelligent Vehicles Symposium, pp. 424-429, Jun. 2006.

Ljubo Mercep. "Context-Centric Design of Automotive Human-Machine Interfaces." PhD thesis, Technische Universiat Munchen. Jan. 2014.

S. Roberts. "Parametric and non-parametric unsupervised cluster analysis." Pattern Recognition. vol. 30, pp. 261-272. Apr. 1996.

J. Sankaran and N. Zoran. Tda2x, a soc optimized for advanced driver assistance systems. Speech and Signal Processing (ICASSP), IEEE International Conference on Acoustics, pp. 2204-2208, May 2014.

R. Schubert, C. Adam, M. Obst, N. Mattern, V. Leonhardt, and G. Wanielik. "Empirical evaluation of vehicular models for ego motion estimation." 2011 IEEE Intelligent Vehicles Symposium (IV), pp. 534-539, Jun. 2011.

Neil Scicluna and Christos-Savvas Bouganis. "ARC 2014: A Multidimensional FPGA-Based Parallel Dbscan Architecture." ACM Transactions on Reconfigurable Technology and Systems. vol. 9, issue 1, pp. 1-12, Nov. 2015.

Qi Yue Shaobo Shi and Qin Wang. "Fpga based accelerator for parallel dbscan algorithm." Computer Modelling & New Technologies. vol. 18, issue 2, pp. 135-142, Jan. 2014.

Z. Taylor and J. Nieto. "Motion-based calibration of multimodal sensor extrinsics and timing o_set estimation." IEEE Transactions on Robotics. vol. 32, issue 5, pp. 1215-1229, Oct. 2016.

Rui Xu and D. Wunsch, II. "Survey of clustering algorithms." Trans. Neur. Netw. vol. 16, issue 3, pp. 645-678, May 2005.

Christopher M. Bishop. "Pattern Recognition and Machine Learning (Information Science and Statistics)." Springer-Verlag New York, Inc., Secaucus, NJ,USA, pp. 423-435, pp. 423-435, Aug. 2006.

Judea Pearl. "Probabilistic Reasoning in Intelligent Systems: Networks of Plausible Inference." Morgan Kaufmann Publishers Inc., San Francisco, CA, USA, p. 116-123, Sep. 1988.

David L. Hall and Sonya A. H. McMullen. "Mathematical techniques in multisensor data fusion." Artech House Information Warfare Library. pp. 1-4, Feb. 2004.

(56) References Cited

OTHER PUBLICATIONS

Fredrik Sandblom et al, "Sensor Data Fusion for Multiple Configurations", 2014Ieee Intelligent Vehicles Syposium Proceedings, Jun. 8, 2014, pp. 1325-1331.

N. Floudas et al: "Multi-Sensor Coordination and Fusion for Automotive Safety Applications", 20069th International Conference on Information Fusion, Fusion 2006 Inst. of Elec. and Elec. Eng. Computer Society US, IEEE, Piscataway, NJ, USA, Jul. 31, 2006, pp. 1-8.

C. Coue et al: "Using Bayesian Programming for Multi-sensor Multi-target Tracking in Automotive Applications"; Proceedings / 2003 IEEE International Conference on Robotics and Automation : Sep. 14-19, 2003. The Grand Hotel. Taipei, Taiwan; [Proceedings of the IEEE International Conference on Robotics and Automation], IEEE Service Center. Piscataway, NJ. ; vol. 2, pp. 2104-2109.

Weiss K et al: "Target modeling and dynamic classification for adaptive sensor data fusion"; Proc. IEEE Intelligent Vehicle Symposium 2003 ; Jun. 9, 2003 (Jun. 9, 2003), pp. 132-137.

Nedevschi et al; "Accurate Ego-Vehicle Global Localization at Intersections Through Alignment of Visual Data With Digital Map"; Jun. 2013, IEEE; pp. 673-687.

Danescu et al; "Stereovision-Based Sensor for Intersection Assistance"; 2009; Advanced Microsystems for Automotive Applications; Springer; pp. 129-163.

\* cited by examiner

SENSOR EVENT DETECTION AND FUSION

RELATED APPLICATION

This patent application claims priority to U.S. Provisional Patent Application No. 62/385,149, filed Sep. 8, 2016, and claims priority to U.S. Provisional Patent Application No. 62/385,156, filed Sep. 8, 2016, which are incorporated by reference herein.

TECHNICAL FIELD

This application is generally related to automated driving and assistance systems and, more specifically, to low-level sensor fusion for automated driving and assistance systems.

BACKGROUND

Many modern vehicles include built-in advanced driver assistance systems (ADAS) to provide automated safety and/or assisted driving functionality. For example, these advanced driver assistance systems can implement adaptive cruise control, automatic parking, automated braking, blind spot monitoring, collision avoidance, driver drowsiness detection, lane departure warning, or the like. The next generation of vehicles can include autonomous driving (AD) systems to control and navigate the vehicles independent of human interaction.

These vehicles typically include multiple sensors, such as one or more cameras, a Light Detection and Ranging (Lidar) sensor, a Radio Detection and Ranging (Radar) system, or the like, to measure different portions of the environment around the vehicles. Each sensor processes their own measurements captured over time to detect an object within their field of view, and then provide a list of detected objects to the advanced driver assistance systems or the autonomous driving systems for their use in implementing automated safety and/or driving functionality. In some instances, the sensors can also provide a confidence level corresponding to their detection of objects on the list based on their captured measurements.

The advanced driver assistance systems or the autonomous driving systems can utilize the list of objects and, in some cases, the associated confidence levels of their detection, to implement automated safety and/or driving functionality. For example, when a radar sensor in the front of a vehicle provides the advanced driver assistance system in the vehicle a list having an object in a current path of the vehicle, the advanced driver assistance system can provide a warning to the driver of the vehicle or control vehicle in order to avoid a collision with the object.

Because some of the sensors can have at least partially overlapping fields of view, the advanced driver assistance systems or the autonomous driving systems can integrate the object lists in an attempt to confirm that an object detected by one sensor was also detected by another sensor. This integration of objects is sometimes referred to as object-level integration. When multiple sensors have detected the same object, the advanced driver assistance systems can increase the confidence level associated with the presence of the object. If, however, the sensors diverge—with a sensor detecting an object and another not detecting the object—the advanced driver assistance systems or the autonomous driving systems have to make a decision about how to react. For example, the advanced driver assistance systems or the autonomous driving systems can assume the presence of the object based on the object list from a single sensor, but with a lower the confidence level, ignore the detection of the object by the sensor, or delay making a decision to see if the sensors alter their object lists over time. Further, since each sensor performs its object detection separately based exclusively on its own captured measurements, as an object moves relative to the vehicle, it may leave a field of view of one sensor and have to be re-detected after entering into a field of view of a different sensor.

SUMMARY

This application discloses a computing system to implement sensor event detection and fusion system in an assisted or automated driving system of a vehicle. The computing system can monitor an environmental model to identify spatial locations in the environmental model populated with temporally-aligned measurement data. The computing system can analyze, on a per-sensor basis, the temporally-aligned measurement data at the spatial locations in the environmental model to detect one or more sensor measurement events. The computing system can utilize the sensor measurement events to identify at least one detection event indicative of an object proximate to the vehicle. The computing system can combine the detection event with at least one of another detection event, a sensor measurement event, or other measurement data to generate a fused detection event. A control system for the vehicle can control operation of the vehicle based, at least in part, on the detection event. Embodiments will be described below in greater detail.

DETAILED DESCRIPTION

Sensor Fusion for Autonomous Driving

Figure 1:
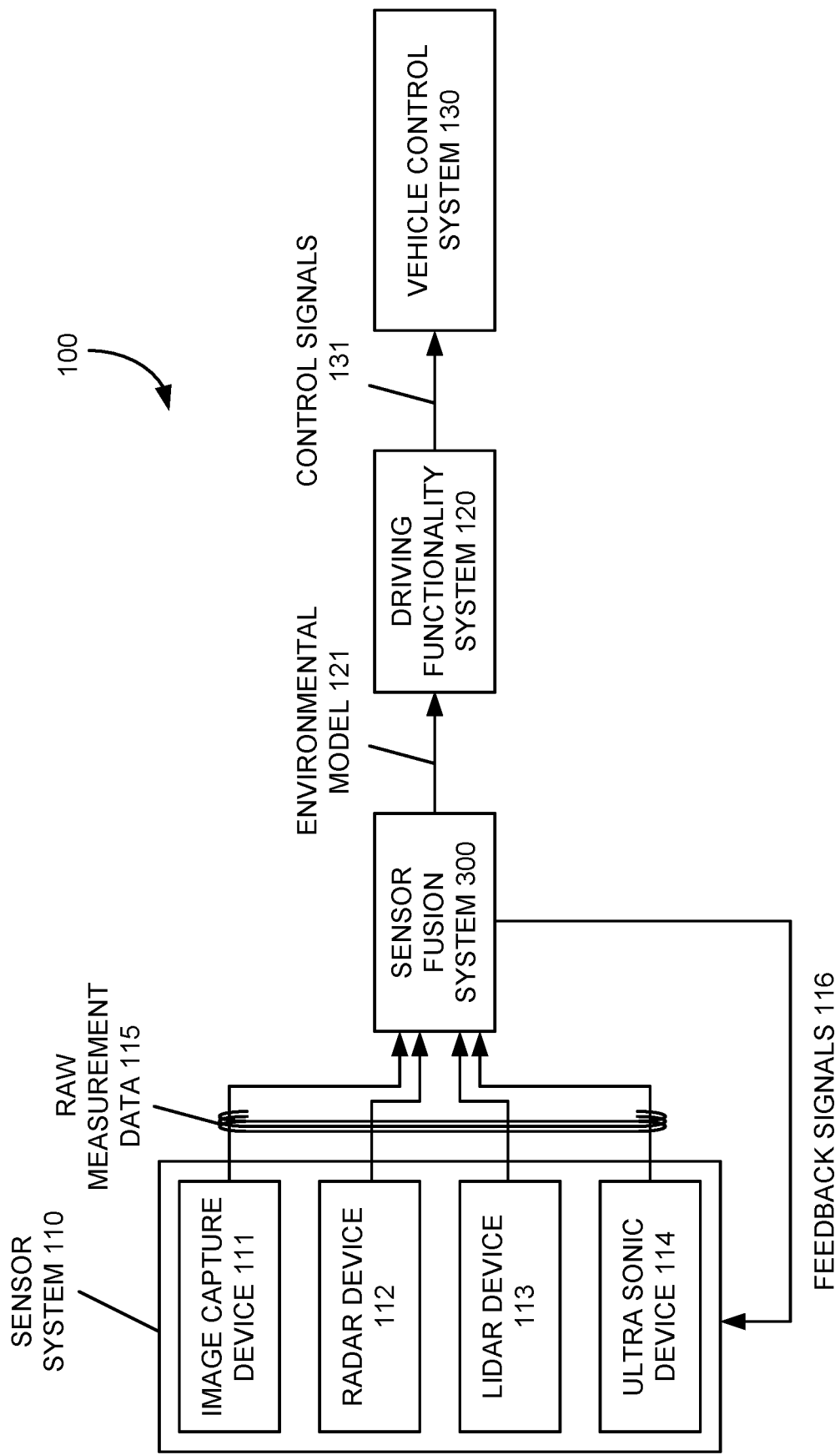
FIG. 1 illustrates an example autonomous driving system according to various embodiments.

FIG. 1 illustrates an example autonomous driving system 100 according to various embodiments. Referring to FIG. 1, the autonomous driving system 100, when installed in a vehicle, can sense an environment surrounding the vehicle and control operation of the vehicle based, at least in part, on the sensed environment.

The autonomous driving system 100 can include a sensor system 110 having multiple sensors, each of which can measure different portions of the environment surrounding the vehicle and output the measurements as raw measurement data 115. The raw measurement data 115 can include characteristics of light, electromagnetic waves, or sound captured by the sensors, such as an intensity or a frequency of the light, electromagnetic waves, or the sound, an angle of reception by the sensors, a time delay between a transmission and the corresponding reception of the light, electromagnetic waves, or the sound, a time of capture of the light, electromagnetic waves, or sound, or the like.

The sensor system 110 can include multiple different types of sensors, such as an image capture device 111, a Radio Detection and Ranging (Radar) device 112, a Light Detection and Ranging (Lidar) device 113, an ultra-sonic device 114, one or more microphones, infrared or night-vision cameras, time-of-flight cameras, cameras capable of detecting and transmitting differences in pixel intensity, or the like. The image capture device 111, such as one or more cameras, can capture at least one image of at least a portion of the environment surrounding the vehicle. The image capture device 111 can output the captured image(s) as raw measurement data 115, which, in some embodiments, can be unprocessed and/or uncompressed pixel data corresponding to the captured image(s).

The radar device 112 can emit radio signals into the environment surrounding the vehicle. Since the emitted radio signals may reflect off of objects in the environment, the radar device 112 can detect the reflected radio signals incoming from the environment. The radar device 112 can measure the incoming radio signals by, for example, measuring a signal strength of the radio signals, a reception angle, a frequency, or the like. The radar device 112 also can measure a time delay between an emission of a radio signal and a measurement of the incoming radio signals from the environment that corresponds to emitted radio signals reflected off of objects in the environment. The radar device 112 can output the measurements of the incoming radio signals as the raw measurement data 115.

The lidar device 113 can transmit light, such as from a laser or other optical transmission device, into the environment surrounding the vehicle. The transmitted light, in some embodiments, can be pulses of ultraviolet light, visible light, near infrared light, or the like. Since the transmitted light can reflect off of objects in the environment, the lidar device 113 can include a photo detector to measure light incoming from the environment. The lidar device 113 can measure the incoming light by, for example, measuring an intensity of the light, a wavelength, or the like. The lidar device 113 also can measure a time delay between a transmission of a light pulse and a measurement of the light incoming from the environment that corresponds to the transmitted light having reflected off of objects in the environment. The lidar device 113 can output the measurements of the incoming light and the time delay as the raw measurement data 115.

The ultra-sonic device 114 can emit acoustic pulses, for example, generated by transducers or the like, into the environment surrounding the vehicle. The ultra-sonic device 114 can detect ultra-sonic sound incoming from the environment, such as, for example, the emitted acoustic pulses having been reflected off of objects in the environment. The ultra-sonic device 114 also can measure a time delay between emission of the acoustic pulses and reception of the ultra-sonic sound from the environment that corresponds to the emitted acoustic pulses having reflected off of objects in the environment. The ultra-sonic device 114 can output the measurements of the incoming ultra-sonic sound and the time delay as the raw measurement data 115.

Figure 2A:
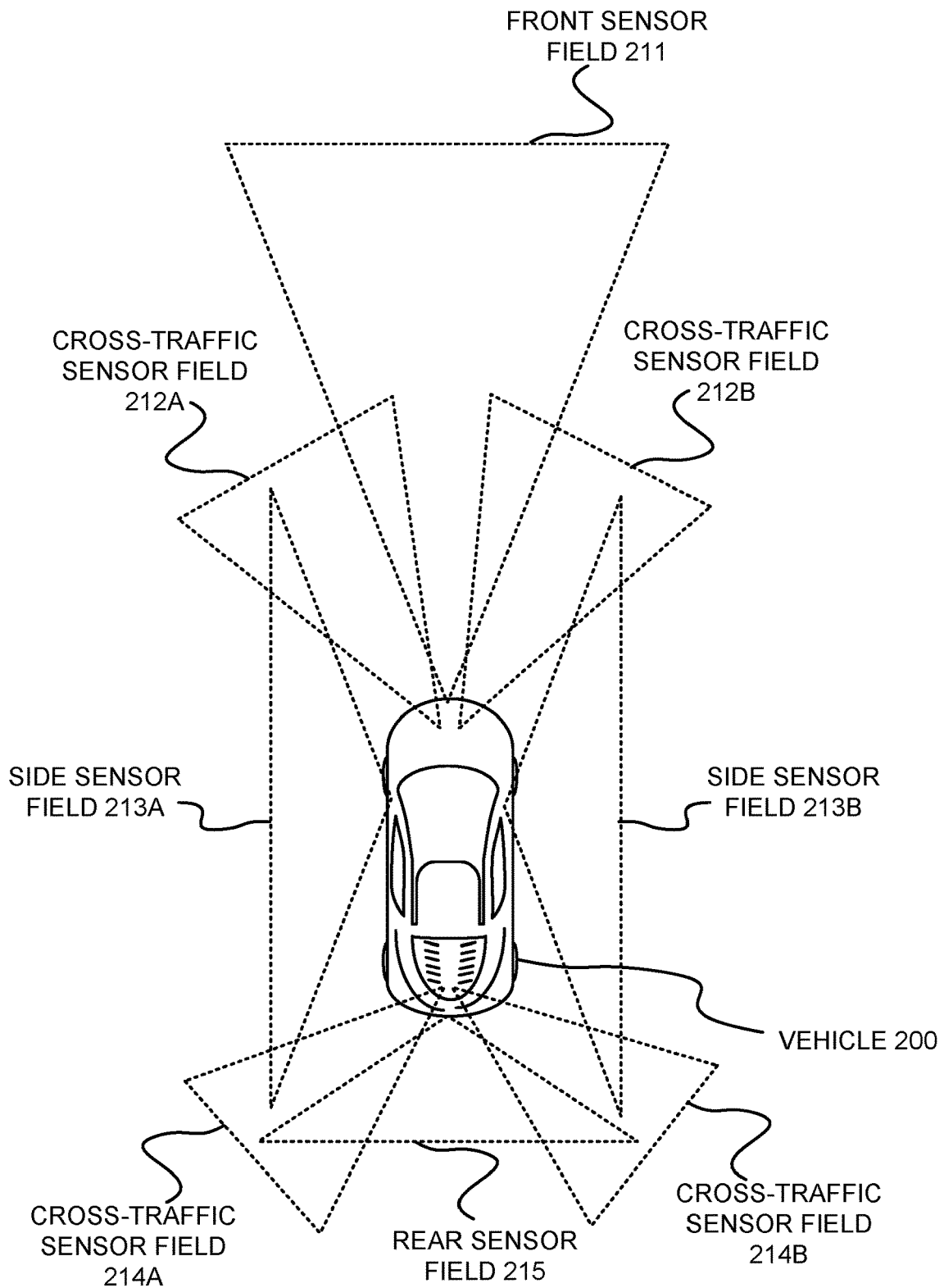
FIG. 2A illustrates an example measurement coordinate fields for a sensor system deployed in a vehicle according to various embodiments.

The different sensors in the sensor system 110 can be mounted in the vehicle to capture measurements for different portions of the environment surrounding the vehicle. FIG. 2A illustrates an example measurement coordinate fields for a sensor system deployed in a vehicle 200 according to various embodiments. Referring to FIG. 2A, the vehicle 200 can include multiple different sensors capable of detecting incoming signals, such as light signals, electromagnetic signals, and sound signals. Each of these different sensors can have a different field of view into an environment around the vehicle 200. These fields of view can allow the sensors to measure light and/or sound in different measurement coordinate fields.

The vehicle in this example includes several different measurement coordinate fields, including a front sensor field 211, multiple cross-traffic sensor fields 212A, 212B, 214A, and 214B, a pair of side sensor fields 213A and 213B, and a rear sensor field 215. Each of the measurement coordinate fields can be sensor-centric, meaning that the measurement coordinate fields can describe a coordinate region relative to a location of its corresponding sensor.

Referring back to FIG. 1, the autonomous driving system 100 can include a sensor fusion system 300 to receive the raw measurement data 115 from the sensor system 110 and populate an environmental model 121 associated with the vehicle with the raw measurement data 115. In some embodiments, the environmental model 121 can have an environmental coordinate field corresponding to a physical envelope surrounding the vehicle, and the sensor fusion system 300 can populate the environmental model 121 with the raw measurement data 115 based on the environmental coordinate field. In some embodiments, the environmental coordinate field can be a non-vehicle centric coordinate field, for example, a world coordinate system, a path-centric coordinate field, or the like.

Figure 2B:
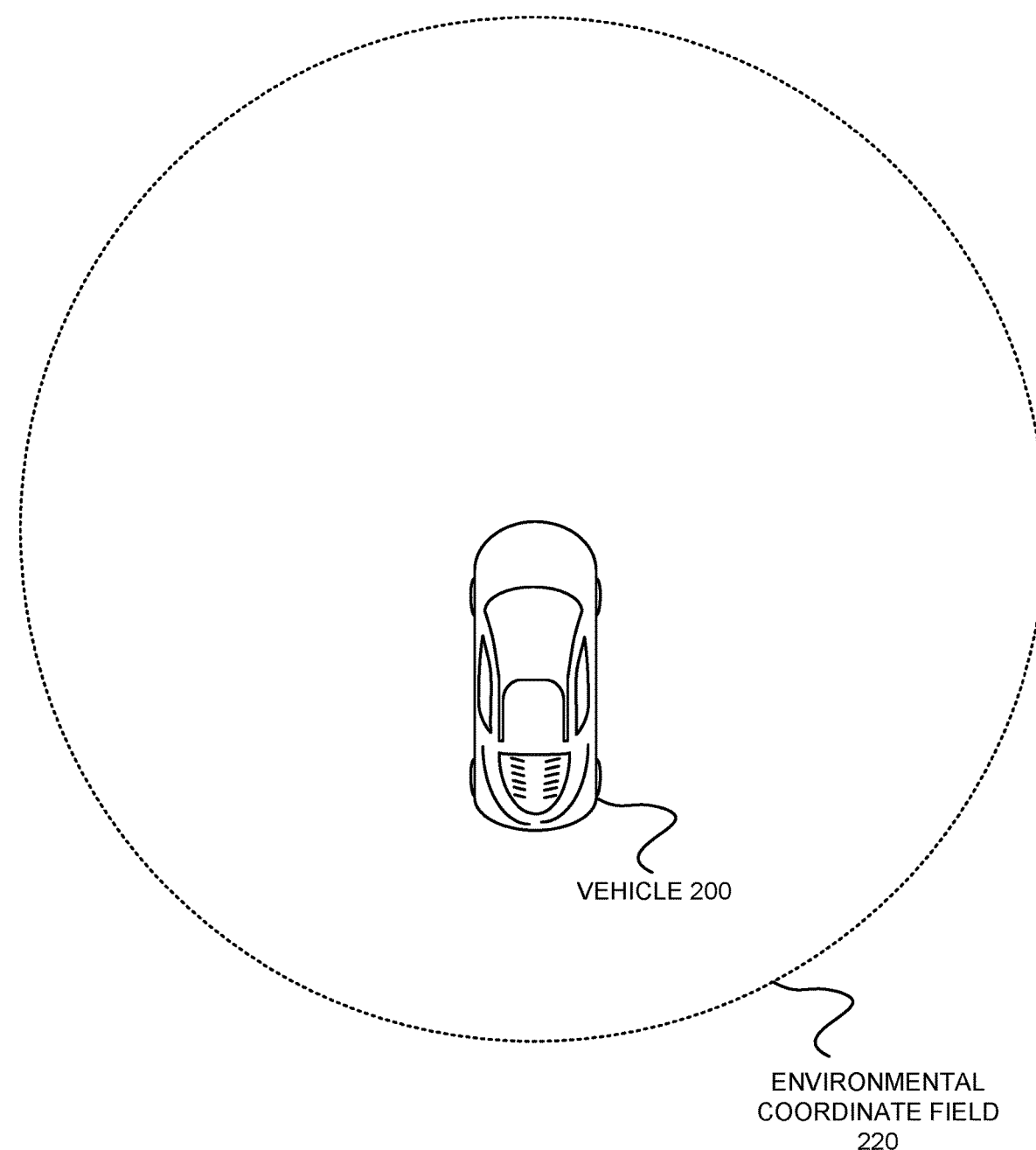
FIG. 2B illustrates an example environmental coordinate field associated with an environmental model for a vehicle according to various embodiments.

FIG. 2B illustrates an example environmental coordinate field 220 associated with an environmental model for the vehicle 200 according to various embodiments. Referring to FIG. 2B, an environment surrounding the vehicle 200 can correspond to the environmental coordinate field 220 for the environmental model. The environmental coordinate field 220 can be vehicle-centric and provide a 360 degree area around the vehicle 200. The environmental model can be populated and annotated with information detected by the sensor fusion system 300 or inputted from external sources. Embodiments will be described below in greater detail.

Referring back to FIG. 1, to populate the raw measurement data 115 into the environmental model 121 associated with the vehicle, the sensor fusion system 300 can spatially align the raw measurement data 115 to the environmental coordinate field of the environmental model 121. The sensor fusion system 300 also can identify when the sensors captured the raw measurement data 115, for example, by time stamping the raw measurement data 115 when received from the sensor system 110. The sensor fusion system 300 can populate the environmental model 121 with the time stamp or other time-of-capture information, which can be utilized to temporally align the raw measurement data 115 in the environmental model 121. In some embodiments, the sensor fusion system 300 can analyze the raw measurement data 115 from the multiple sensors as populated in the environmental model 121 to detect a sensor event or at least one object in the environmental coordinate field associated with the vehicle. The sensor event can include a sensor measurement event corresponding to a presence of the raw measurement data 115 in the environmental model 121, for example, above a noise threshold. The sensor event can include a sensor detection event corresponding to a spatial and/or temporal grouping of the raw measurement data 115 in the environmental model 121. The object can correspond to spatial grouping of the raw measurement data 115 having been tracked in the environmental model 121 over a period of time, allowing the sensor fusion system 300 to determine the raw measurement data 115 corresponds to an object around the vehicle. The sensor fusion system 300 can populate the environment model 121 with an indication of the detected sensor event or detected object and a confidence level of the detection. Embodiments of sensor fusion and sensor event detection or object detection will be described below in greater detail.

The sensor fusion system 300, in some embodiments, can generate feedback signals 116 to provide to the sensor system 110. The feedback signals 116 can be configured to prompt the sensor system 110 to calibrate one or more of its sensors. For example, the sensor system 110, in response to the feedback signals 116, can re-position at least one of its sensors, expand a field of view of at least one of its sensors, change a refresh rate or exposure time of at least one of its sensors, alter a mode of operation of at least one of its sensors, or the like.

The autonomous driving system 100 can include a driving functionality system 120 to receive at least a portion of the environmental model 121 from the sensor fusion system 300. The driving functionality system 120 can analyze the data included in the environmental model 121 to implement automated driving functionality or automated safety and assisted driving functionality for the vehicle. The driving functionality system 120 can generate control signals 131 based on the analysis of the environmental model 121.

The autonomous driving system 100 can include a vehicle control system 130 to receive the control signals 131 from the driving functionality system 120. The vehicle control system 130 can include mechanisms to control operation of the vehicle, for example by controlling different functions of the vehicle, such as braking, acceleration, steering, parking brake, transmission, user interfaces, warning systems, or the like, in response to the control signals.

Figure 3:
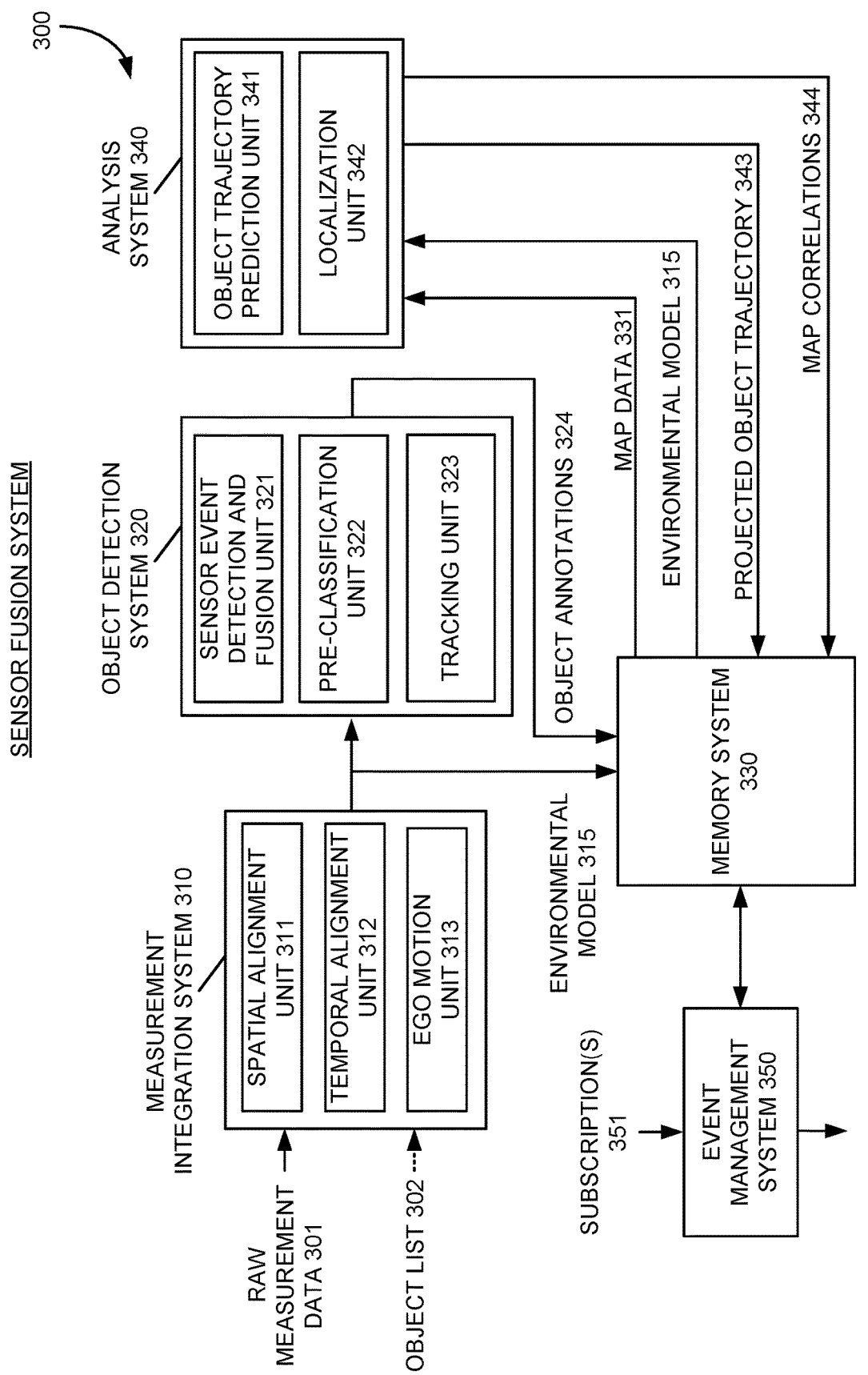
FIG. 3 illustrates an example sensor fusion system according to various examples.

FIG. 3 illustrates an example sensor fusion system 300 according to various examples. Referring to FIG. 3, the sensor fusion system 300 can include a measurement integration system 310 to receive raw measurement data 301 from multiple sensors mounted in a vehicle. The measurement integration system 310 can generate an environmental model 315 for the vehicle, which can be populated with the raw measurement data 301.

The measurement integration system 310 can include a spatial alignment unit 311 to correlate measurement coordinate fields of the sensors to an environmental coordinate field for the environmental model 315. The measurement integration system 310 can utilize this correlation to convert or translate locations for the raw measurement data 301 within the measurement coordinate fields into locations within the environmental coordinate field. The measurement integration system 310 can populate the environmental model 315 with the raw measurement data 301 based on the correlation between the measurement coordinate fields of the sensors to the environmental coordinate field for the environmental model 315.

The measurement integration system 310 also can temporally align the raw measurement data 301 from different sensors in the sensor system. In some embodiments, the measurement integration system 310 can include a temporal alignment unit 312 to assign time stamps to the raw measurement data 301 based on when the sensor captured the raw measurement data 301, when the raw measurement data 301 was received by the measurement integration system 310, or the like. In some embodiments, the temporal alignment unit 312 can convert a capture time of the raw measurement data 301 provided by the sensors into a time corresponding to the sensor fusion system 300. The measurement integration system 310 can annotate the raw measurement data 301 populated in the environmental model 315 with the time stamps for the raw measurement data 301. The time stamps for the raw measurement data 301 can be utilized by the sensor fusion system 300 to group the raw measurement data 301 in the environmental model 315 into different time periods or time slices. In some embodiments, a size or duration of the time periods or time slices can be based, at least in part, on a refresh rate of one or more sensors in the sensor system. For example, the sensor fusion system 300 can set a time slice to correspond to the sensor with a fastest rate of providing new raw measurement data 301 to the sensor fusion system 300.

The measurement integration system 310 can include an ego motion unit 313 to compensate for movement of at least one sensor capturing the raw measurement data 301, for example, due to the vehicle driving or moving in the environment. The ego motion unit 313 can estimate motion of the sensor capturing the raw measurement data 301, for example, by utilizing tracking functionality to analyze vehicle motion information, such as global positioning system (GPS) data, inertial measurements, vehicle odometer data, video images, or the like. The tracking functionality can implement a Kalman filter, a Particle filter, optical flow-based estimator, or the like, to track motion of the vehicle and its corresponding sensors relative to the environment surrounding the vehicle.

The ego motion unit 313 can utilize the estimated motion of the sensor to modify the correlation between the measurement coordinate field of the sensor to the environmental coordinate field for the environmental model 315. This compensation of the correlation can allow the measurement integration system 310 to populate the environmental model 315 with the raw measurement data 301 at locations of the environmental coordinate field where the raw measurement data 301 was captured as opposed to the current location of the sensor at the end of its measurement capture.

In some embodiments, the measurement integration system 310 may receive objects or object lists 302 from a variety of sources. The measurement integration system 310 can receive the object list 302 from sources external to the vehicle, such as in a vehicle-to-vehicle (V2V) communication, a vehicle-to-infrastructure (V2I) communication, a vehicle-to-pedestrian (V2P) communication, a vehicle-to-device (V2D) communication, a vehicle-to-grid (V2G) communication, or generally a vehicle-to-everything (V2X) communication. The measurement integration system 310 also can receive the objects or an object list 302 from other systems internal to the vehicle, such as from a human machine interface, mapping systems, localization system, driving functionality system, vehicle control system, or the vehicle may be equipped with at least one sensor that outputs the object list 302 rather than the raw measurement data 301.

The measurement integration system 310 can receive the object list 302 and populate one or more objects from the object list 302 into the environmental model 315 along with the raw measurement data 301. The object list 302 may include one or more objects, a time stamp for each object, and optionally include a spatial metadata associated with a location of objects in the object list 302. For example, the object list 302 can include speed measurements for the vehicle, which may not include a spatial component to be stored in the object list 302 as the spatial metadata. When the object list 302 includes a confidence level associated with an object in the object list 302, the measurement integration system 310 also can annotate the environmental model 315 with the confidence level for the object from the object list 302.

Figure 4:
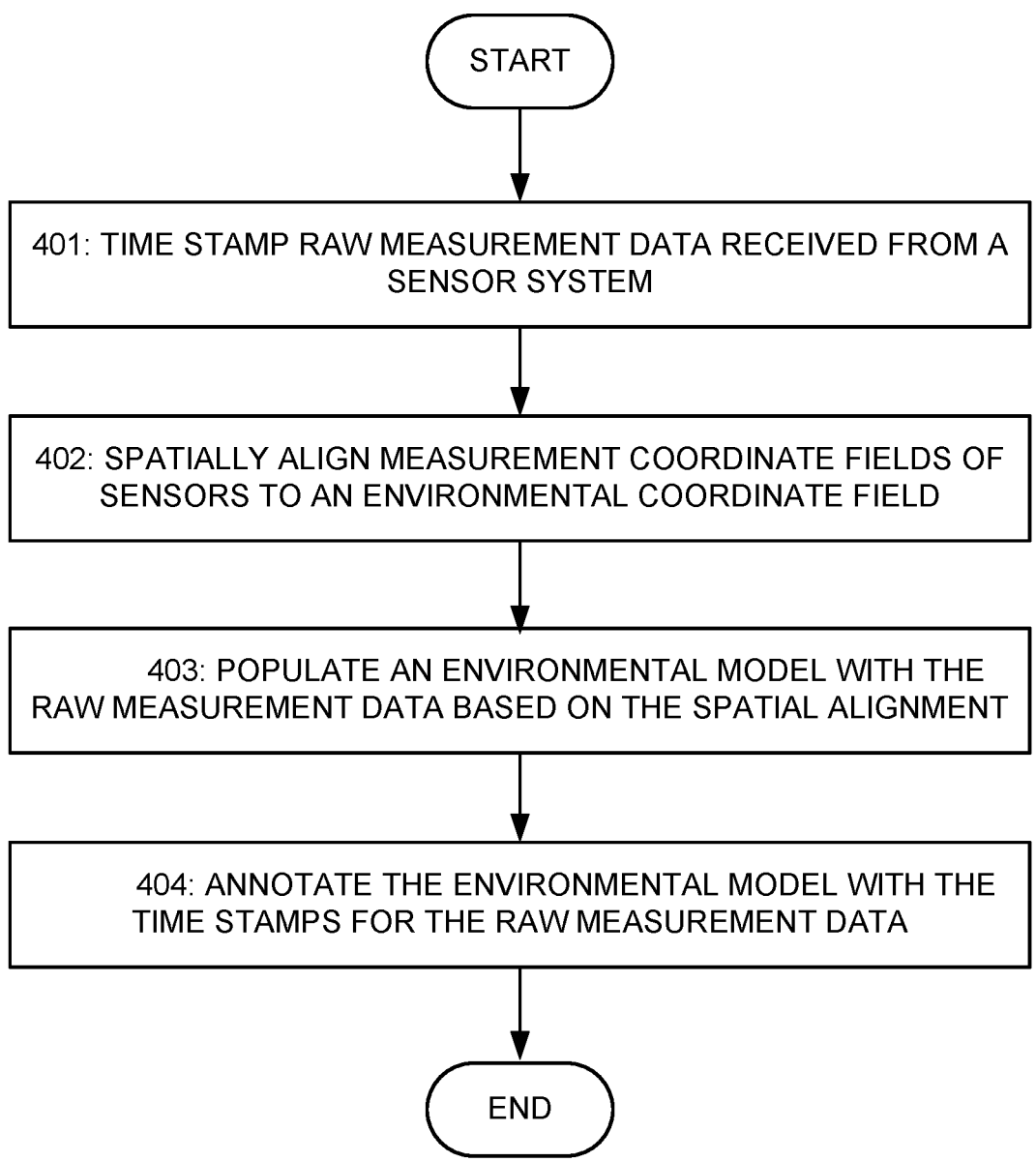
FIG. 4 illustrates an example flowchart for low-level sensor fusion according to various examples.

FIG. 4 illustrates an example flowchart for low-level sensor fusion according to various examples. Referring to FIG. 4, in a block 401, a computing system implementing low-level sensor fusion time stamps raw measurement data received from a sensor system. The computing system can assign time stamps to the raw measurement data based on when each sensor captured the raw measurement data, when the raw measurement data was received by the computing system, or the like. In some embodiments, the computing system may adjust the assigned time stamp by a preset time delay associated with the transmission of the raw measurement data from the sensor system to the computing system. The computing system can assign the time stamps to the raw measurement data by converting a capture time of the raw measurement data provided by the sensor system into a global time of the computing system.

In a block 402, the computing system implementing low-level sensor fusion spatially aligns measurement coordinate fields of sensors to an environmental coordinate field. The computing system can identify where the measurement coordinate fields of the sensors fall within the environmental coordinate field for the environmental model, for example, based on where the sensors are mounted in the vehicle and the type of sensor associated with each measurement coordinate field.

In a block 403, the computing system implementing low-level sensor fusion populates an environmental model with the raw measurement data based on the spatial alignment. The computing system can utilize the correlation between the measurement coordinate fields of sensors to the environmental coordinate field to convert or translate locations of the raw measurement data into locations within the environmental model. The computing system can populate the environmental model with the raw measurement data based on the correlation between the measurement coordinate fields of the sensors to the environmental coordinate field for the environmental model.

In a block 404, the computing system implementing low-level sensor fusion annotates the environmental model with the time stamps for the raw measurement data. The time stamps for the raw measurement data can be utilized by the computing system to group the raw measurement data in the environmental model into different time periods or time slices. In some embodiments, a size or duration of the time periods or time slices can be based, at least in part, on a refresh rate of one or more sensors in the sensor system. For example, the computing system can set a time slice to correspond to the sensor with a fastest rate of providing new raw measurement data to the computing system. Although FIG. 4 shows blocks 401-404 being performed in a particular order, in some embodiments, the computing system can perform operations in the blocks 401-404 in a different order or in parallel, or the operations in some of the blocks 401-404 may be merged or divided into additional blocks.

Referring back to FIG. 3, the sensor fusion system 300 can include an object detection system 320 to receive the environmental model 315 from the measurement integration system 310. In some embodiments, the sensor fusion system 300 can include a memory system 330 to store the environmental model 315 from the measurement integration system 310. The object detection system 320 may access the environmental model 315 from the memory system 330.

The object detection system 320 can analyze data stored in the environmental model 315 to detect a sensor detection event or at least one object. The sensor fusion system 300 can populate the environment model 315 with an indication of the sensor detection event or detected object at a location in the environmental coordinate field corresponding to the detection. The sensor fusion system 300 also can identify a confidence level associated with the detection, which can be based on at least one of a quantity, a quality, or a sensor diversity of raw measurement data 301 utilized in detecting the sensor detection event or detected object. The sensor fusion system 300 can populate the environment model 315 with the confidence level associated with the detection. For example, the object detection system 320 can annotate the environmental model 315 with object annotations 324, which populates the environmental model 315 with the detected sensor detection event or detected object and corresponding confidence level of the detection.

The object detection system 320 can include a sensor event detection and fusion unit 321 to monitor the environmental model 315 to detect sensor measurement events. The sensor measurement events can identify locations in the environmental model 315 having been populated with the raw measurement data 301 for a sensor, for example, above a threshold corresponding to noise in the environment. In some embodiments, the sensor event detection and fusion unit 321 can detect the sensor measurement events by identifying changes in intensity within the raw measurement data 301 over time, changes in reflections within the raw measurement data 301 over time, change in pixel values, or the like.

The sensor event detection and fusion unit 321 can analyze the raw measurement data 301 in the environmental model 315 at the locations associated with the sensor measurement events to detect one or more sensor detection events. In some embodiments, the sensor event detection and fusion unit 321 can identify a sensor detection event when the raw measurement data 301 associated with a single sensor meets or exceeds sensor event detection threshold. For example, the sensor event detection and fusion unit 321 can analyze an image captured by a camera in the raw measurement data 301 to identify edges in the image, shapes in the image, or the like, which the sensor event detection and fusion unit 321 can utilize to identify a sensor detection event for the image. The sensor event detection and fusion unit 321 also may analyze groups of intensity points in raw measurement data 301 corresponding to a lidar sensor or groups reflections in raw measurement data 301 corresponding to a radar sensor to determine the a sensor detection event for raw measurement data 301 for those sensors.

The sensor event detection and fusion unit 321, in some embodiments, can combine the identified sensor detection event for a single sensor with raw measurement data 301 associated with one or more sensor measurement events or sensor detection events captured by at least another sensor to generate a fused sensor detection event. The fused sensor detection event can correspond to raw measurement data 301 from multiple sensors, at least one of which corresponds to the sensor detection event identified by the sensor event detection and fusion unit 321.

The object detection system 320 can include a pre-classification unit 322 to assign a pre-classification to the sensor detection event or the fused sensor detection event. In some embodiments, the pre-classification can correspond to a type of object, such as another vehicle, a pedestrian, a cyclist, an animal, a static object, or the like. The pre-classification unit 322 can annotate the environmental model 315 with the sensor detection event, the fused sensor detection event and/or the assigned pre-classification.

The object detection system 320 also can include a tracking unit 323 to track the sensor detection events or the fused sensor detection events in the environmental model 315 over time, for example, by analyzing the annotations in the environmental model 315, and determine whether the sensor detection event or the fused sensor detection event corresponds to an object in the environmental coordinate system. In some embodiments, the tracking unit 323 can track the sensor detection event or the fused sensor detection event utilizing at least one state change prediction model, such as a kinetic model, a probabilistic model, or other state change prediction model. The tracking unit 323 can select the state change prediction model to utilize to track the sensor detection event or the fused sensor detection event based on the assigned pre-classification of the sensor detection event or the fused sensor detection event by the pre-classification unit 322. The state change prediction model may allow the tracking unit 323 to implement a state transition prediction, which can assume or predict future states of the sensor detection event or the fused sensor detection event, for example, based on a location of the sensor detection event or the fused sensor detection event in the environmental model 315, a prior movement of the sensor detection event or the fused sensor detection event, a classification of the sensor detection event or the fused sensor detection event, or the like. In some embodiments, for example, the tracking unit 323 implementing the kinetic model can utilize kinetic equations for velocity, acceleration, momentum, or the like, to assume or predict the future states of the sensor detection event or the fused sensor detection event based, at least in part, on its prior states. The tracking unit 323 may determine a difference between the predicted future state of the sensor detection event or the fused sensor detection event and its actual future state, which the tracking unit 323 may utilize to determine whether the sensor detection event or the fused sensor detection event is an object. After the sensor detection event or the fused sensor detection event has been identified by the pre-classification unit 322, the tracking unit 323 can track the sensor detection event or the fused sensor detection event in the environmental coordinate field associated with the environmental model 315, for example, across multiple different sensors and their corresponding measurement coordinate fields.

When the tracking unit 323, based on the tracking of the sensor detection event or the fused sensor detection event with the state change prediction model, determines the sensor detection event or the fused sensor detection event is an object, the object tracking unit 323 can annotate the environmental model 315 to indicate the presence of the object. The tracking unit 323 can continue tracking the detected object over time by implementing the state change prediction model for the object and analyzing the environmental model 315 when updated with additional raw measurement data 301. After the object has been detected, the tracking unit 323 can track the object in the environmental coordinate field associated with the environmental model 315, for example, across multiple different sensors and their corresponding measurement coordinate fields.

Figure 5:
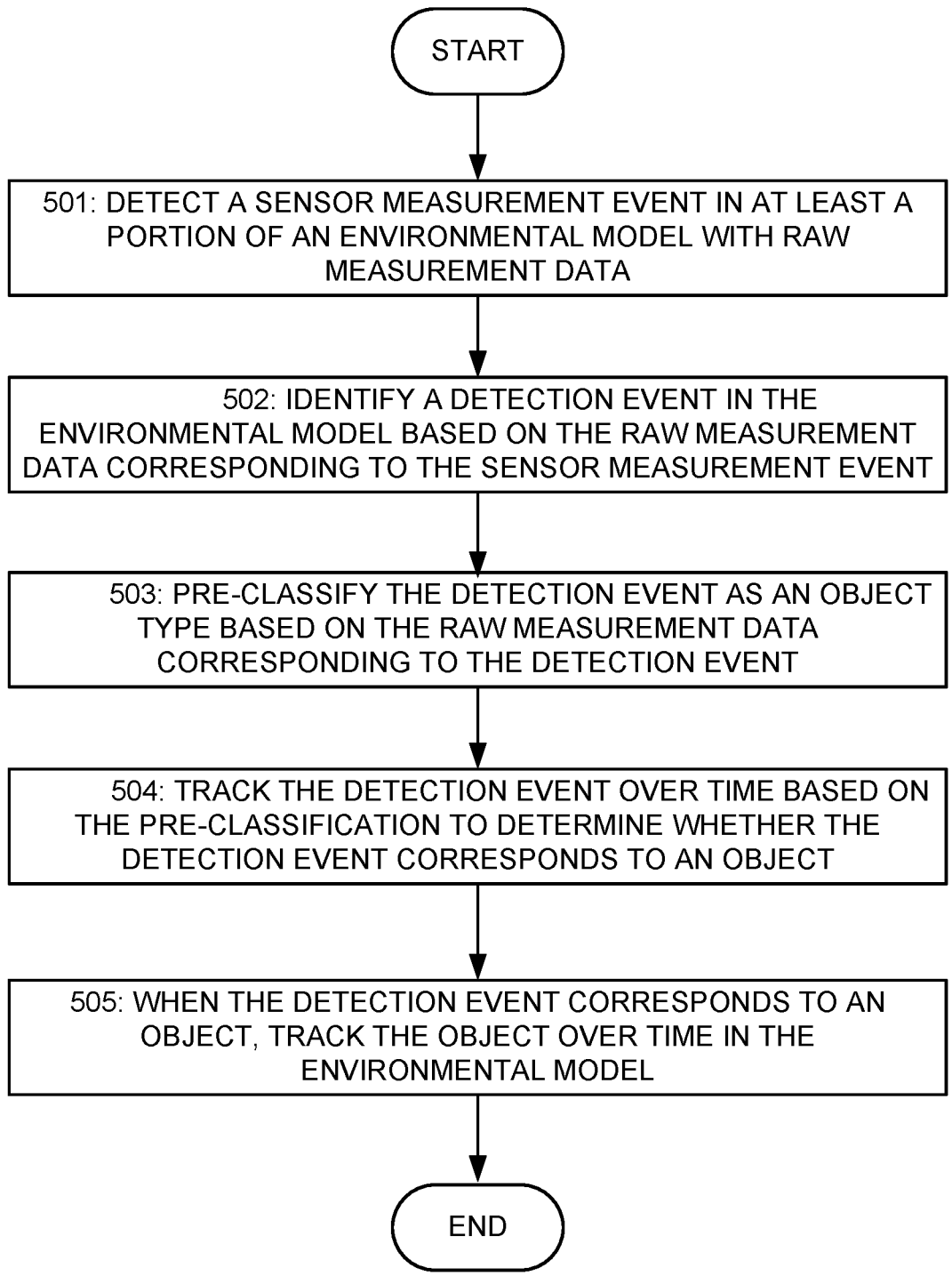
FIG. 5 illustrates an example flowchart for object tracking based on an environmental model generated by low-level sensor fusion according to various examples.

FIG. 5 illustrates an example flowchart for object tracking based on an environmental model generated by low-level sensor fusion according to various examples. Referring to FIG. 5, in a block 501, a computing system implementing object tracking can detect a sensor measurement event in at least a portion of an environmental model with raw measurement data. The sensor measurement event can identify locations in the environmental model having been populated with the raw measurement data, for example, above a noise threshold. In some embodiments, the computing system can detect the sensor measurement event by identifying changes in intensity within the raw measurement data over time, changes in reflections within the raw measurement data over time, change in pixel values, or the like.

In a block 502, the computing system implementing object tracking can identify a detection event, such as a sensor detection event or a fused sensor detection event in the environmental model based on the raw measurement data corresponding to the sensor measurement event. The computing system can analyze the raw measurement data in the environmental model at the locations associated with the sensor measurement event to detect the sensor detection event or the fused sensor detection event.

In a block 503, the computing system implementing object tracking can pre-classify the detection event as an object type based on the raw measurement data corresponding to the detection event. In some embodiments, the object type in the pre-classification can correspond to another vehicle, a pedestrian, a cyclist, an animal, a static object, or the like. The computing system can annotate the environmental model with the sensor detection event, the fused sensor detection event, and/or the assigned pre-classification of the detection event.

In a block 504, the computing system implementing object tracking can track the detection event over time based on the pre-classification to determine whether the detection event corresponds to an object. In some embodiments, the computing system can track the sensor detection event and/or the fused sensor detection event utilizing at least one state change prediction model, which can predict dynamic movement of the sensor event over time. The computing system can select the state change prediction model to utilize to track the sensor detection event and/or the fused sensor detection event based on the assigned pre-classification of the detection event.

In a block 505, when the detection event corresponds to an object, the computing system implementing object tracking can track the object over time in the environmental model. The computing system can annotate the environmental model to indicate the presence of the object corresponding to the detection event. The computing system can track the detected object by analyzing the environmental model when updated over time with additional raw measurement data.

Referring back to FIG. 3, the sensor fusion system 300 can include an analysis system 340 to develop information from the environmental model 315 for utilization by automated driving functionality in a vehicle control system. The analysis system 340 can include an object trajectory prediction unit 341 to generate a projected object trajectory 343 of a tracked object proximate to the vehicle. The object trajectory prediction unit 341 can access the environmental model 315 and associated annotations from the memory system 330 or receive them directly from the measurement integration system 310 and/or the object detection system 320. The object trajectory prediction unit 341 can utilize the environmental model 315 along with the state change prediction model corresponding to the tracked object to predict movement of the tracked object relative to the vehicle in the future. Since a tracked object may have a multitude of options for moving in the future, in some embodiments, the object trajectory prediction unit 341 can generate a range of expected trajectories along with probabilities associated with the expected trajectories in the range. The object trajectory prediction unit 341 can annotate the environmental model 315 with the projected object trajectory 343, for example, by storing the projected object trajectory 343 in the environmental model 315 residing the in memory system 330.

The analysis system 340 can include a localization unit 342 to receive the environmental model 315 and map data 331, for example, from the memory system 330. The map data 331 can include topographical maps, terrain maps, street view maps, or the like, of an area corresponding to a location of the vehicle. The map data 331 can include features, such as roadways, signs, traffic signals, transit crossings, pedestrian crossings, buildings, trees, structures, terrain gradients, topographical edges, or like.

The localization unit 342 can correlate raw measurement data 301 in the environmental model 315 to landmarks or objects in the map data 331. These map correlations 344 can identify a position of the vehicle relative to the map data 331. For example, the localization unit 342 can identify a mail box in the map data 331 and then correlate a tracked object, a tracked sensor detection event, or a tracked fused sensor detection event in the environmental model 315 to the identified mail box. The localization unit 342 can annotate the environmental model 315 with the map correlations 344. In some embodiments, when the localization unit 342 can identify the map correlations 344 between a tracked sensor detection event or a tracked fused sensor detection event and the map data 331, the localization unit 342 may inform the object detection system 320 and/or the object trajectory prediction unit 341 of the map correlations 344, which can allow the object detection system 320 and/or the object trajectory prediction unit 341 to confirm the tracked sensor detection event or tracked fused sensor detection event corresponds to an object.

The localization unit 342 may determine portions of the map data 331 may be incomplete or missing, for example, when the localization unit 342 is unable to correlate raw measurement data 301 in the environmental model 315 to landmarks or objects in the map data 331. In some embodiments, the localization unit 342 can flag these sections of the map data 331 as incomplete or missing, so a control system for the vehicle proceeds with caution in this area. The localization unit 342 may generate portions of the incomplete or missing map data based, at least in part, on the measurement data in the environmental model 315. For example, the localization unit 342 may populate the map data 331 with data in the environmental model 315. The localization unit 342 can store the generated map data to the memory system 330 for subsequent utilization when traversing that area or to upload the generated map data to an external server for utilization by other vehicles.

The sensor fusion system 300 can include an event management system 350 to supply a vehicle control system with information corresponding to the environmental model 315 and its associated annotations. The event management system 350 can receive subscriptions 351 from one or more processes or components in a driving functionality system. Each of the subscriptions 351 may identify at least one region of interest (ROI) in the environmental coordinate field of the environmental model 315 for the sensor fusion system 300 to monitor for events, such as sensor measurement events, sensor detection events, fused sensor detection events, or the like, or to monitor for tracked objects or tracked object trajectory predictions. The regions of interest can correspond to portions of the environmental coordinate field associated with a particular driving or safety functionality. For example, a process or component interested in rear collision avoidance may provide the event management system 350 a subscription to a region of interest behind the vehicle.

The event management system 350 can monitor the memory system 330 for annotations to the environmental model 315 that correspond to events and/or receive indications of events directly from the object detection system 320. When the event management system 350 detects an event corresponding to a region of interest in a subscription 351, the event management system 350 can provide event data 352 to the processes or components subscribed to that region of interest. In some embodiments, the event data 352 can be a portion of the environmental model 315 and any of its annotations corresponding to the subscribed event and the region of interest.

The event management system 350 also can suggest dynamic changes to the subscriptions 351, for example, based on the mode of operation of the vehicle, a planned path or route the vehicle expects to traverse, features in map data 331, or the like. For example, the event management system 350 or other portion of the sensor fusion system 300 can identify locations of upcoming traffic lights or signage and suggest the process or component in the driving functionality system expand its region of interest or issue a subscription 351 to a new region of interest to include the upcoming traffic lights or signage. In another example, the event management system 350 or other portion of the sensor fusion system 300 can identify the vehicle plans to make a turn and suggest the process or component in the driving functionality system expand its region of interest to include areas corresponding to the road after making the turn.

Figure 6:
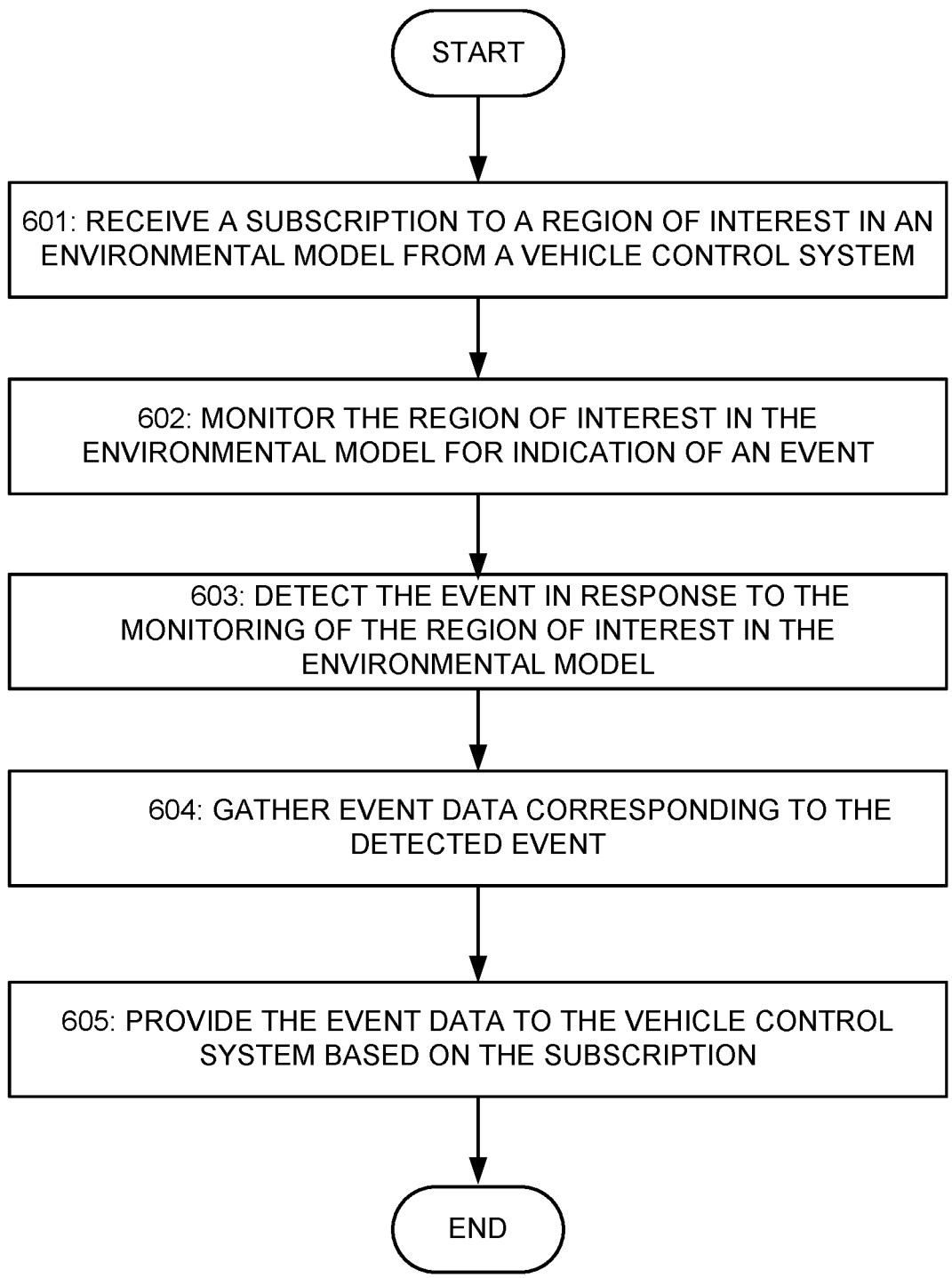
FIG. 6 illustrates an example flowchart for managing regions of interest in an environmental model according to various examples.

FIG. 6 illustrates an example flowchart for environmental model event management according to various examples. Referring to FIG. 6, in a block 601, a computing system implementing environmental model event management can receive a subscription to a region of interest in an environmental model from a driving functionality system. The region of interest can correspond to a portion of an environmental coordinate field in the environmental model associated with a particular driving or safety functionality.

In a block 602, the computing system implementing environmental model event management can monitor the region of interest in the environmental model for indication of an event. In some embodiments, the computing system can monitor a memory system storing the environmental model for updates to the environmental model or may receive updates directly from a sensor fusion device.

In a block 603, the computing system implementing environmental model event management can detect the event in response to the monitoring of the region of interest in the environmental model. In some embodiments, the event may be a sensor measurement event, which can correspond to raw measurement data from a sensor was populated into the region of interest in the environmental model. The event also may be a sensor detection event or a fused sensor detection event. The event may also correspond to a detection of an object, which may have been annotated into the environmental model. The event may also correspond to a detection of a projected trajectory entering the region of interest, which may have been annotated into the environmental model.

In a block 604, the computing system implementing environmental model event management can gather event data corresponding to the detected event, and in a block 605, the computing system implementing environmental model event management can provide the event data to the vehicle control system based on the subscription. The computing system may access the environmental model stored in the memory system, and extract data from the environmental model corresponding to the region of interest. In some embodiments, the environmental model may include data corresponding to multiple different time periods or time slices, so the computing system can retrieve the data corresponding to the one or more time slices relative to the detected event.

Illustrative Operating Environment

The execution of various low-level sensor fusion and driving automation processes according to embodiments may be implemented using computer-executable software instructions executed by one or more programmable computing devices. Because these embodiments may be implemented using software instructions, the components and operation of a programmable computer system on which various embodiments may be employed will be described below.

Figure 7:
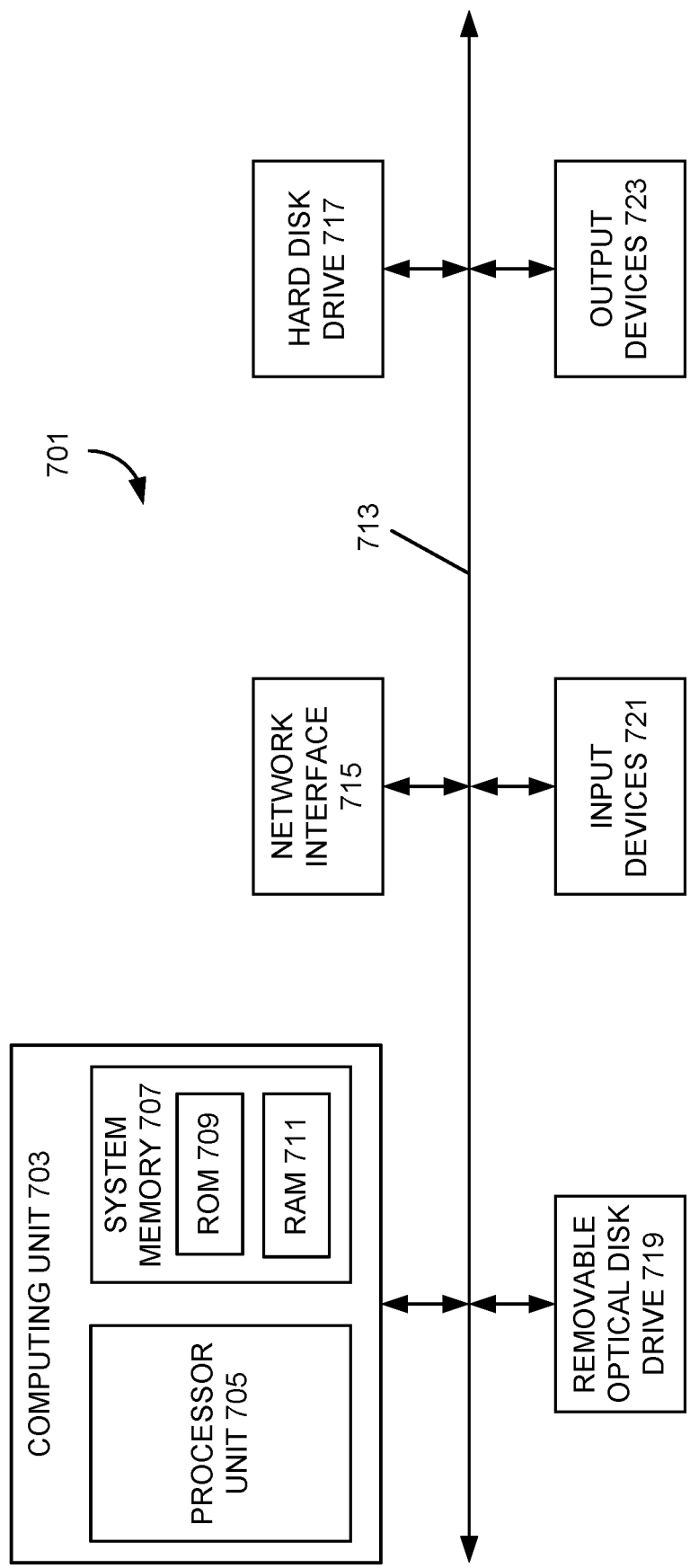
FIGS. 7 and 8 illustrate an example of a computer system of the type that may be used to implement various embodiments.
Figure 8:
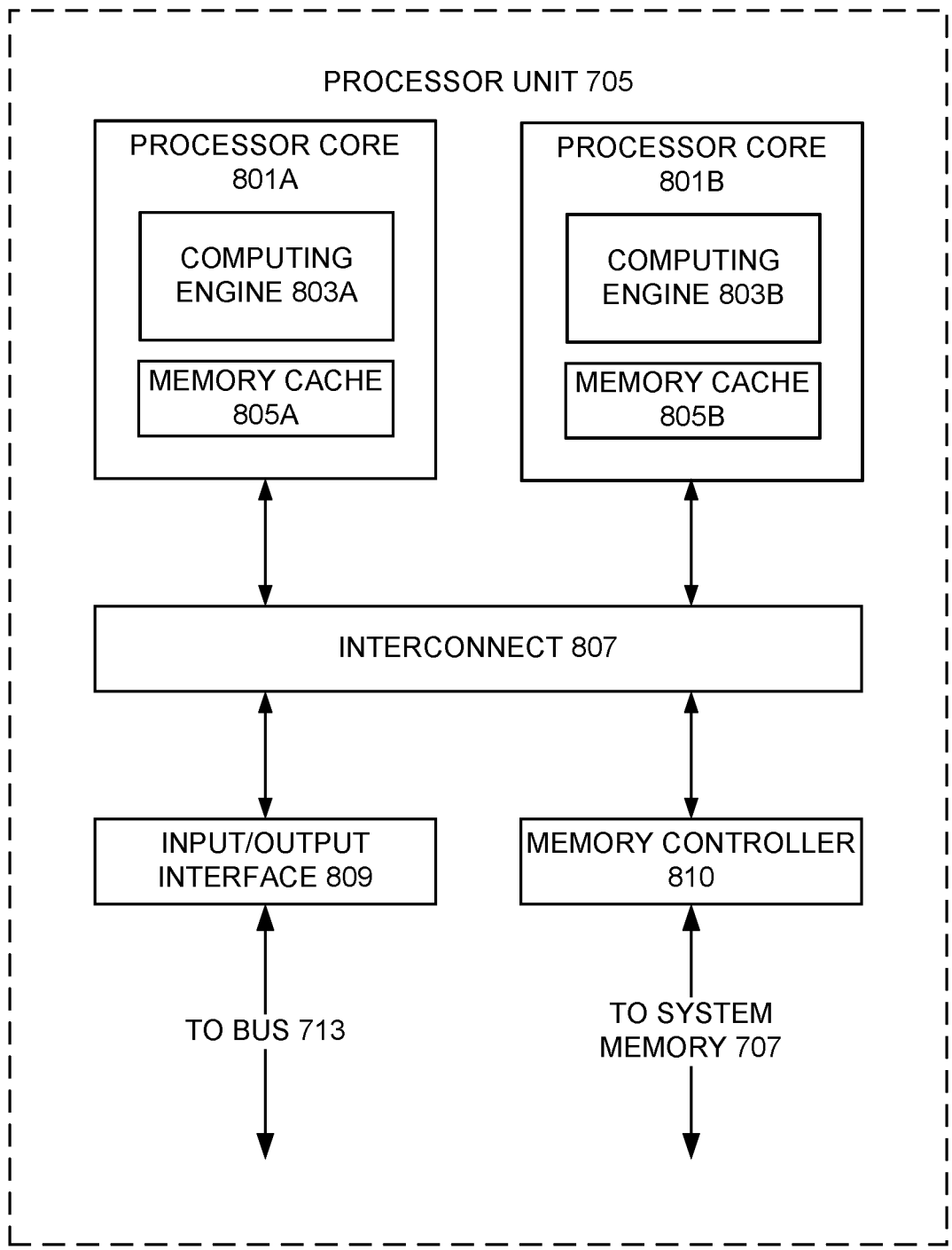

FIGS. 7 and 8 illustrate an example of a computer system of the type that may be used to implement various embodiments. Referring to FIG. 7, various examples may be implemented through the execution of software instructions by a computing device 701, such as a programmable computer. Accordingly, FIG. 7 shows an illustrative example of a computing device 701. As seen in FIG. 7, the computing device 701 includes a computing unit 703 with a processing unit 705 and a system memory 707. The processing unit 705 may be any type of programmable electronic device for executing software instructions, but will conventionally be a microprocessor. The system memory 707 may include both a read-only memory (ROM) 709 and a random access memory (RAM) 711. As will be appreciated by those of ordinary skill in the art, both the read-only memory (ROM) 709 and the random access memory (RAM) 711 may store software instructions for execution by the processing unit 705.

The processing unit 705 and the system memory 707 are connected, either directly or indirectly, through a bus 713 or alternate communication structure, to one or more peripheral devices 717-723. For example, the processing unit 705 or the system memory 707 may be directly or indirectly connected to one or more additional memory storage devices, such as a hard disk drive 717, which can be magnetic and/or removable, a removable optical disk drive 719, and/or a flash memory card. The processing unit 705 and the system memory 707 also may be directly or indirectly connected to one or more input devices 721 and one or more output devices 723. The input devices 721 may include, for example, a keyboard, a pointing device (such as a mouse, touchpad, stylus, trackball, or joystick), a scanner, a camera, and a microphone. The output devices 723 may include, for example, a monitor display, a printer and speakers. With various examples of the computing device 701, one or more of the peripheral devices 717-723 may be internally housed with the computing unit 703. Alternately, one or more of the peripheral devices 717-723 may be external to the housing for the computing unit 703 and connected to the bus 713 through, for example, a Universal Serial Bus (USB) connection.

With some implementations, the computing unit 703 may be directly or indirectly connected to a network interface 715 for communicating with other devices making up a network. The network interface 715 can translate data and control signals from the computing unit 703 into network messages according to one or more communication protocols, such as the transmission control protocol (TCP) and the Internet protocol (IP). Also, the network interface 715 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 701 is illustrated as an example only, and it not intended to be limiting. Various embodiments may be implemented using one or more computing devices that include the components of the computing device 701 illustrated in FIG. 7, which include only a subset of the components illustrated in FIG. 7, or which include an alternate combination of components, including components that are not shown in FIG. 7. For example, various embodiments may be implemented using a multi-processor computer, a plurality of single and/or multiprocessor computers arranged into a network, or some combination of both.

With some implementations, the processor unit 705 can have more than one processor core. Accordingly, FIG. 8 illustrates an example of a multi-core processor unit 705 that may be employed with various embodiments. As seen in this figure, the processor unit 705 includes a plurality of processor cores 801A and 801B. Each processor core 801A and 801B includes a computing engine 803A and 803B, respectively, and a memory cache 805A and 805B, respectively. As known to those of ordinary skill in the art, a computing engine 803A and 803B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 803A and 803B may then use its corresponding memory cache 805A and 805B, respectively, to quickly store and retrieve data and/or instructions for execution.

Each processor core 801A and 801B is connected to an interconnect 807. The particular construction of the interconnect 807 may vary depending upon the architecture of the processor unit 705. With some processor cores 801A and 801B, such as the Cell microprocessor created by Sony Corporation, Toshiba Corporation and IBM Corporation, the interconnect 807 may be implemented as an interconnect bus. With other processor units 801A and 801B, however, such as the Opteron™ and Athlon™ dual-core processors available from Advanced Micro Devices of Sunnyvale, Calif., the interconnect 807 may be implemented as a system request interface device. In any case, the processor cores 801A and 801B communicate through the interconnect 807 with an input/output interface 809 and a memory controller 810. The input/output interface 809 provides a communication interface between the processor unit 705 and the bus 713. Similarly, the memory controller 810 controls the exchange of information between the processor unit 705 and the system memory 707. With some implementations, the processor unit 705 may include additional components, such as a high-level cache memory accessible shared by the processor cores 801A and 801B. It also should be appreciated that the description of the computer network illustrated in FIG. 7 and FIG. 8 is provided as an example only, and it not intended to suggest any limitation as to the scope of use or functionality of alternate embodiments.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in a computer-readable memory device. The memory device may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory device may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory devices may be "read only" by design (ROM) by virtue of permission settings, or not. Other examples of memory devices may include, but may not be limited to, WORM, EPROM, EEPROM, FLASH, NVRAM, OTP, or the like, which may be implemented in solid state semiconductor devices. Other memory devices may comprise moving parts, such as a known rotating disk drive. All such memory devices may be "machine-readable" and may be readable by a processing device.

Operating instructions or commands may be implemented or embodied in tangible forms of stored computer software (also known as "computer program" or "code"). Programs, or code, may be stored in a digital memory device and may be read by the processing device. "Computer-readable storage medium" (or alternatively, "machine-readable storage medium") may include all of the foregoing types of computer-readable memory devices, as well as new technologies of the future, as long as the memory devices may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments, those skilled in the art will appreciate that there are numerous variations and permutations of the above described systems and techniques that fall within the spirit and scope of the invention as set forth in the appended claims. For example, while specific terminology has been employed above to refer to systems and processes, it should be appreciated that various examples of the invention may be implemented using any desired combination of systems and processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
monitoring, by a computing system, an environmental model stored in a memory system to identify when spatial locations in the environmental model become populated with temporally-aligned raw measurement data captured by multiple sensors mounted in a vehicle, wherein the environmental model stored in the memory system includes the raw measurement data captured by the multiple sensors, which has been both spatially-aligned and temporally-aligned in the environmental model;
analyzing, by the computing system on a per-sensor basis, the temporally-aligned raw measurement data at the spatial locations in the environmental model to detect one or more sensor measurement events, wherein each of the one or more sensor measurement events identify a location in the environmental model having been populated with the raw measurement data captured by one of the sensors at a level above a threshold for noise in an environment around the vehicle; and
utilizing, by the computing system, the raw measurement data at the locations identified by one or more sensor measurement events corresponding to the raw measurement data to identify at least one detection event indicative of an object proximate to the vehicle, wherein a control system for the vehicle is configured to control operation of the vehicle based, at least in part, on the at least one detection event.

2. The method of claim 1, further comprising populating, by the computing system, at least one of the spatial locations in the environmental model with at least one indication of the detection event or the one or more sensor measurement events.

3. The method of claim 1, wherein the identification of the detection event further comprises generating the detection event when the temporally-aligned raw measurement data corresponding to one of the sensor measurement events exceeds a detection threshold.

4. The method of claim 1, further comprises combining, by the computing system, the detection event with at least one of another detection event corresponding to a different sensor, one or more of the sensor measurement events corresponding to a different sensor, or the temporally-aligned raw measurement data to generate a fused detection event indicative of the object proximate to the vehicle.

5. The method of claim 1, further comprising generating, by the computing system, a confidence level associated with the detection event, wherein the confidence level corresponds to a probability that the detection event corresponds to an object.

6. The method of claim 5, further comprising annotating, by the computing system, the detection event populated in the environmental model with the confidence level.

7. An apparatus comprising at least one memory device storing instructions configured to cause one or more processing devices to perform operations comprising:
    monitoring an environmental model stored in a memory system to identify when spatial locations in the environmental model become populated with temporally-aligned raw measurement data captured by multiple sensors mounted in a vehicle, wherein the environmental model stored in the memory system includes the raw measurement data captured by the multiple sensors, which has been both spatially-aligned and temporally-aligned in the environmental model;
    analyzing, on a per-sensor basis, the temporally-aligned raw measurement data at the spatial locations in the environmental model to detect one or more sensor measurement events, wherein each of the one or more sensor measurement events identify a location in the environmental model having been populated with the raw measurement data captured by one of the sensors at a level above a threshold for noise in an environment around the vehicle; and
    utilizing the raw measurement data at the locations identified by one or more sensor measurement events corresponding to the raw measurement data to identify at least one detection event indicative of an object proximate to the vehicle, wherein a control system for the vehicle is configured to control operation of the vehicle based, at least in part, on the at least one detection event.

8. The apparatus of claim 7, wherein the instructions are further configured to cause the one or more processing devices to perform operations comprising populating at least one of the spatial locations in the environmental model with at least one indication of the detection event or the one or more sensor measurement events.

9. The apparatus of claim 7, wherein the identification of the detection event further comprises generating the detection event when the temporally-aligned raw measurement data corresponding to one of the sensor measurement events exceeds a detection threshold.

10. The apparatus of claim 7, wherein the instructions are further configured to cause the one or more processing devices to perform operations comprising combining the detection event with at least one of another detection event corresponding to a different sensor, one or more of the sensor measurement events corresponding to a different sensor, or the temporally-aligned raw measurement data to generate a fused detection event indicative of the object proximate to the vehicle.

11. The apparatus of claim 7, wherein the instructions are further configured to cause the one or more processing devices to perform operations comprising generating a confidence level associated with the detection event, wherein the confidence level corresponds to a probability that the detection event corresponds to an object.

12. The apparatus of claim 11, wherein the instructions are further configured to cause the one or more processing devices to perform operations comprising annotating the detection event populated in the environmental model with the confidence level.

13. A system comprising:
    a memory device configured to store machine-readable instructions; and
    a computing system including one or more processing devices, in response to executing the machine-readable instructions, configured to:
        monitor an environmental model stored in a memory system to identify when spatial locations in the environmental model become populated with temporally-aligned raw measurement data captured by multiple sensors mounted in a vehicle, wherein the environmental model stored in the memory system includes the raw measurement data captured by the multiple sensors, which has been both spatially-aligned and temporally-aligned in the environmental model;
        analyze, on a per-sensor basis, the temporally-aligned raw measurement data at the spatial locations in the environmental model to detect one or more sensor measurement events, wherein each of the one or more sensor measurement events identify a location in the environmental model having been populated with the raw measurement data captured by one of the sensors at a level above a threshold for noise in an environment around the vehicle; and
        utilize the raw measurement data at the locations identified by one or more sensor measurement events corresponding to the raw measurement data to identify at least one detection event indicative of an object proximate to the vehicle, wherein a control system for the vehicle is configured to control operation of the vehicle based, at least in part, on the at least one detection event.

14. The system of claim 13, wherein the one or more processing devices, in response to executing the machine-readable instructions, are configured to populate at least one of the spatial locations in the environmental model with at least one indication of the detection event or the one or more sensor measurement events.

15. The system of claim 13, wherein the identification of the detection event further comprises generating the detection event when the temporally-aligned raw measurement data corresponding to one of the sensor measurement events exceeds a detection threshold.

16. The system of claim 13, wherein the one or more processing devices, in response to executing the machine-readable instructions, are configured to combine the detection event with at least one of another detection event corresponding to a different sensor, one or more of the sensor measurement events corresponding to a different sensor, or the temporally-aligned raw measurement data to generate a fused detection event indicative of the object proximate to the vehicle.

17. The system of claim 13, wherein the one or more processing devices, in response to executing the machine-readable instructions, are configured to:
    generate a confidence level associated with the detection event, wherein the confidence level corresponds to a probability that the detection event corresponds to an object; and annotate the detection event populated in the environmental model with the confidence level.

* * * * *